US011146233B2

(12) United States Patent
Kishimoto et al.

(10) Patent No.: US 11,146,233 B2
(45) Date of Patent: Oct. 12, 2021

(54) ELASTIC WAVE DEVICE AND MANUFACTURING METHOD THEREFOR

(71) Applicant: Murata Manufacturing Co., Ltd., Nagaokakyo (JP)

(72) Inventors: Yutaka Kishimoto, Nagaokakyo (JP); Masashi Omura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1072 days.

(21) Appl. No.: 15/679,327

(22) Filed: Aug. 17, 2017

(65) Prior Publication Data
US 2017/0366160 A1 Dec. 21, 2017

Related U.S. Application Data
(63) Continuation of application No. PCT/JP2016/051030, filed on Jan. 14, 2016.

(30) Foreign Application Priority Data
Mar. 16, 2015 (JP) .............................. JP2015-051815

(51) Int. Cl.
*H03H 9/02* (2006.01)
*H03H 3/02* (2006.01)
(Continued)

(52) U.S. Cl.
CPC .......... *H03H 9/02842* (2013.01); *H03H 3/02* (2013.01); *H03H 3/10* (2013.01);
(Continued)

(58) Field of Classification Search
CPC ........ H03H 9/02842; H03H 3/02; H03H 3/10; H03H 9/0211; H03H 9/02228;
(Continued)

(56) References Cited

U.S. PATENT DOCUMENTS

2005/0134406 A1 6/2005 Inoue
2006/0119230 A1* 6/2006 Umeda .................. H03H 9/172
310/358

(Continued)

FOREIGN PATENT DOCUMENTS

JP 2005-159606 A 6/2005
JP 2007-129391 A 5/2007

(Continued)

OTHER PUBLICATIONS

Official Communication issued in International Patent Application No. PCT/JP2016/051030, dated Mar. 29, 2016.

*Primary Examiner* — Bryan P Gordon
(74) *Attorney, Agent, or Firm* — Keating & Bennett, LLP

(57) ABSTRACT

An elastic wave device in which an IDT electrode defines an excitation electrode on a piezoelectric layer, an acoustic reflection layer is laminated on a first main surface of the piezoelectric layer, the acoustic reflection layer includes high acoustic impedance layers with a relatively high acoustic impedance and low acoustic impedance layers with a relatively low acoustic impedance, and the acoustic reflection layer has an unwanted wave reflection suppression structure in which reflection of unwanted waves toward the piezoelectric layer side is significantly reduced or prevented.

14 Claims, 6 Drawing Sheets

(51) Int. Cl.
  *H03H 9/17* (2006.01)
  *H03H 3/10* (2006.01)
  *H01L 41/047* (2006.01)
  *H01L 41/29* (2013.01)
(52) U.S. Cl.
  CPC ...... *H03H 9/0211* (2013.01); *H03H 9/02228* (2013.01); *H03H 9/175* (2013.01); *H01L 41/047* (2013.01); *H01L 41/29* (2013.01); *H03H 2003/025* (2013.01)
(58) Field of Classification Search
  CPC .............. H03H 9/175; H03H 2003/025; H01L 41/047; H01L 41/29
  USPC .................................................. 310/311–371
  See application file for complete search history.

(56) References Cited

U.S. PATENT DOCUMENTS

| | | | |
|---|---|---|---|
| 2009/0053401 A1 | 2/2009 | Uppili et al. | |
| 2010/0148638 A1* | 6/2010 | Umeda | H03H 3/02 |
| | | | 310/367 |
| 2013/0285768 A1* | 10/2013 | Watanabe | H03H 3/02 |
| | | | 333/193 |
| 2014/0152146 A1 | 6/2014 | Kimura et al. | |
| 2014/0273881 A1 | 9/2014 | Tajic | |
| 2014/0312994 A1 | 10/2014 | Meltaus et al. | |
| 2015/0182999 A1* | 7/2015 | Zhao | B06B 1/0622 |
| | | | 310/334 |
| 2017/0373663 A1* | 12/2017 | Kishimoto | H03H 9/175 |
| 2018/0091116 A1* | 3/2018 | Kai | H03H 9/1064 |
| 2019/0319602 A1* | 10/2019 | Sturzebecher | H03H 9/205 |
| 2019/0346407 A1* | 11/2019 | Campanella-Pineda | G01N 29/022 |
| 2019/0348966 A1* | 11/2019 | Campanella-Pineda | H03H 3/02 |

FOREIGN PATENT DOCUMENTS

| | | | | |
|---|---|---|---|---|
| JP | 2007-208845 A | | 8/2007 | |
| JP | 2007208845 | * | 8/2007 | ............ H01L 41/09 |
| JP | 2014-176095 A | | 9/2014 | |
| KR | 10-2014-0101773 A | | 8/2014 | |
| WO | 2009/029134 A1 | | 3/2009 | |
| WO | 2012/086441 A1 | | 6/2012 | |

\* cited by examiner

ELASTIC WAVE DEVICE AND MANUFACTURING METHOD THEREFOR

This application claims the benefit of priority to Japanese Patent Application No. 2015-051815 filed on Mar. 16, 2015 and is a Continuation Application of PCT Application No. PCT/JP2016/051030 filed on Jan. 14, 2016. The entire contents of each application are hereby incorporated herein by reference.

BACKGROUND OF THE INVENTION

1. Field of the Invention

The present invention relates to an elastic wave device and a manufacturing method therefor.

2. Description of the Related Art

Various elastic wave devices using bulk waves or plate waves have been suggested. Regarding elastic wave devices of this type, a structure in which a cavity is omitted by providing an acoustic reflection layer has been known. For example, in an elastic wave device described in International Publication No. WO 12/086441, an IDT electrode is formed on one main surface of a piezoelectric layer, and an acoustic reflection layer is laminated on the other main surface of the piezoelectric layer. The acoustic reflection layer includes a structure in which a high acoustic impedance layer and a low acoustic impedance layer are laminated.

An elastic wave device including an acoustic reflection layer is capable of causing elastic waves leaking from a piezoelectric layer side to the acoustic reflection layer side to be reflected toward the piezoelectric layer side by the acoustic reflection layer. Accordingly, the excitation efficiency of elastic waves may be increased. However, not only elastic waves to be used but also unwanted waves are also reflected. Therefore, a problem occurs in that the unwanted waves degrade resonance characteristics, filter characteristics, and the like.

SUMMARY OF THE INVENTION

Preferred embodiments of the present invention provide elastic wave devices in which characteristics are less likely to be degraded by unwanted waves.

According to a first broad aspect of a preferred embodiment of the present invention, an elastic wave device includes a piezoelectric layer that includes a first main surface and a second main surface which is opposite the first main surface; an excitation electrode that is in contact with the piezoelectric layer; and an acoustic reflection layer that is provided on the first main surface of the piezoelectric layer. The acoustic reflection layer includes a high acoustic impedance layer having a relatively high acoustic impedance and a low acoustic impedance layer having a relatively low acoustic impedance. The acoustic reflection layer has an unwanted wave reflection suppression structure in which reflection of an unwanted wave toward the piezoelectric layer side is significantly reduced or prevented.

According to a second broad aspect of a preferred embodiment of the present invention, an elastic wave device includes a piezoelectric layer that includes a first main surface and a second main surface which is opposite the first main surface; a first excitation electrode and a second excitation electrode that are in contact with the piezoelectric layer; and an acoustic reflection layer that is provided on the first main surface of the piezoelectric layer. The acoustic reflection layer includes a high acoustic impedance layer including a pair of opposing main surfaces and having a relatively high acoustic impedance and a low acoustic impedance layer including a pair of opposing main surfaces and having a relatively low acoustic impedance. In the acoustic reflection layer, outer peripheral edges of individual main surfaces of the pair of main surfaces of at least one of the low acoustic impedance layer and the high acoustic impedance layer are curved so as not to be located within surfaces where the individual main surfaces at a center of the at least one of the low acoustic impedance layer and the high acoustic impedance layer are extended in an outer peripheral edge direction.

According to a third broad aspect of a preferred embodiment of the present invention, an elastic wave device includes a piezoelectric layer that includes a first main surface and a second main surface which is opposite the first main surface; a first excitation electrode and a second excitation electrode that are in contact with the piezoelectric layer; and an acoustic reflection layer that is provided on the first main surface of the piezoelectric layer. The acoustic reflection layer includes a high acoustic impedance layer having a relatively high acoustic impedance and a low acoustic impedance layer having a relatively low acoustic impedance. On an outer peripheral side surface of the acoustic reflection layer, an outer peripheral side surface of at least one of the high acoustic impedance layer and the low acoustic impedance layer is separate from outer peripheral side surfaces of other layers with a step therebetween.

According to a specific aspect of a preferred embodiment of the present invention, in an elastic wave device, the excitation electrode is an IDT electrode, and the IDT electrode is provided on at least one of the first main surface and the second main surface of the piezoelectric layer. In this case, elastic waves such as plate waves are excited by the IDT electrode.

According to another specific aspect of a preferred embodiment of the present invention, in an elastic wave device, the IDT electrode is provided on the second main surface of the piezoelectric layer. In this case, the IDT electrode is opposite the acoustic reflection layer, and elastic waves thus are excited more effectively.

According to another specific aspect of a preferred embodiment of the present invention, in an elastic wave device, plate waves excited by the IDT electrode are used.

According to another specific aspect of a preferred embodiment of the present invention, in an elastic wave device, the excitation electrode includes a first excitation electrode which is provided on the first main surface of the piezoelectric layer and a second excitation electrode which is provided on the second main surface of the piezoelectric layer. In this case, bulk waves are excited effectively between the first and second excitation electrodes.

According to still another specific aspect of a preferred embodiment of the present invention, in an elastic wave device, bulk waves are excited by the first excitation electrode and the second excitation electrode.

A manufacturing method for an elastic wave device according to an aspect of a preferred embodiment of the present invention is a method for manufacturing an elastic wave device configured according to an aspect of a preferred embodiment of the present invention.

A manufacturing method for the elastic wave device according to the first broad aspect of a preferred embodiment of the present invention includes a step of forming a film on the piezoelectric layer such that the acoustic reflection layer including at least one low acoustic impedance layer and at least one high acoustic impedance layer has the unwanted wave reflection suppression structure; and a step of forming the excitation electrode to be in contact with the piezoelectric layer.

A manufacturing method for the elastic wave device according to the second broad aspect of a preferred embodiment of the present invention includes a step of forming the acoustic reflection layer on the piezoelectric layer; and a step of forming the excitation electrode to be in contact with the piezoelectric layer. In a process of forming the acoustic reflection layer, the outer peripheral edges of the individual main surfaces of the pair of main surfaces of the at least one of the high acoustic impedance layer and the low acoustic impedance layer are curved so as not to be located within the surfaces where the individual main surfaces at the center of the at least one of the high acoustic impedance layer and the low acoustic impedance layer are extended in the outer peripheral edge direction. In this case, unwanted waves are irregularly reflected in an effective manner, and influence of the unwanted waves are reduced effectively.

A manufacturing method for the elastic wave device according to the third broad aspect of a preferred embodiment of the present invention includes a step of forming the acoustic reflection layer on the piezoelectric layer; and a step of forming the excitation electrode to be in contact with the piezoelectric layer. In a process of forming the acoustic reflection layer, the at least one of the high acoustic impedance layer and the low acoustic impedance layer is formed such that the outer peripheral side surface of the at least one of the high acoustic impedance layer and the low acoustic impedance layer is separate from the outer peripheral side surfaces of the other layers with a step therebetween. In this case, by arranging an outer peripheral side surface of at least one layer separately from outer peripheral side surfaces of other layers with a step therebetween, unwanted waves partially cancel each other out. Therefore, influence of the unwanted waves is reduced effectively.

The elastic wave devices according to the first to third broad aspects of various preferred embodiments of the present invention significantly reduce or prevent reflection of unwanted waves toward a piezoelectric layer side. Therefore, characteristics of the elastic wave devices such as resonance characteristics and filter characteristics are less likely to be degraded.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will become apparent by providing explanation for specific preferred embodiments of the present invention with reference to drawings.

It is pointed out that preferred embodiments described herein are examples, and partial replacement or combination of configurations in different preferred embodiments is possible.

Figure 1A:
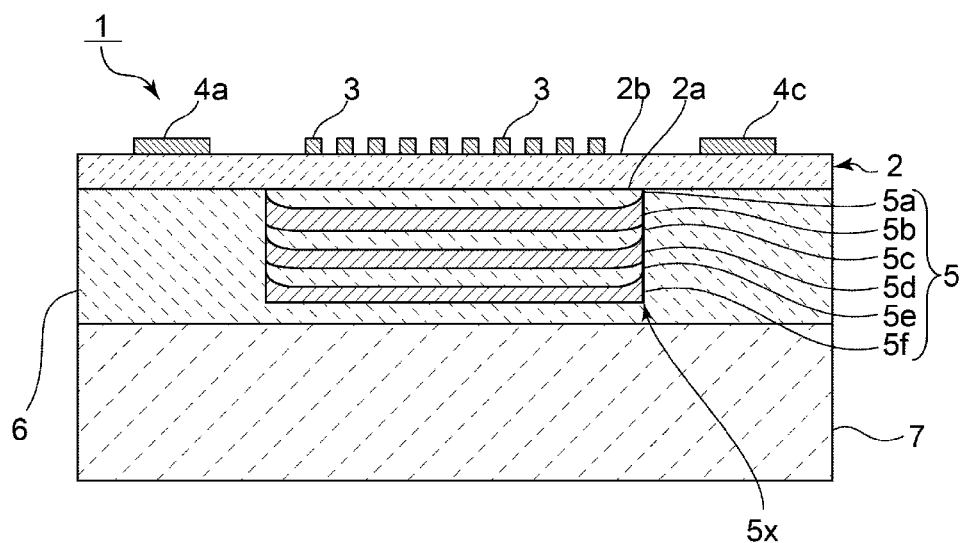
FIG. 1A is a front cross-sectional view of an elastic wave device according to a first preferred embodiment of the present invention.
Figure 1B:
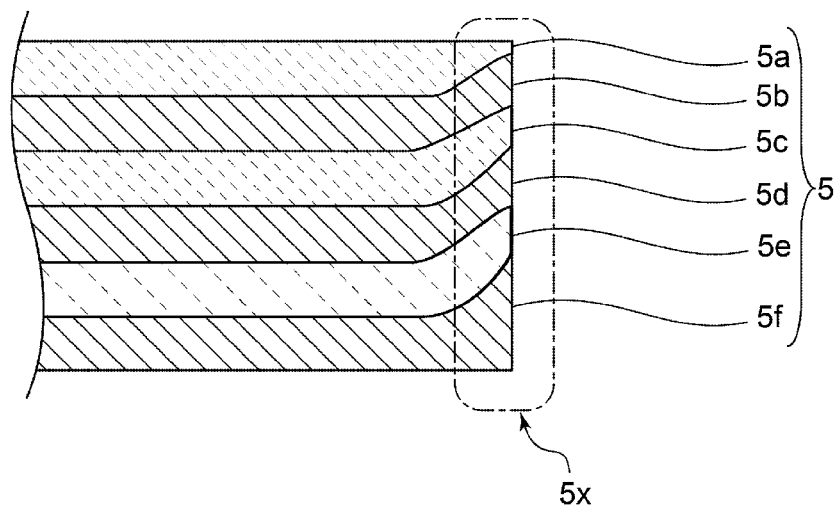
FIG. 1B is a partially cut-out front cross-sectional view which illustrates a main portion of the elastic wave device in an enlarged manner.
Figure 2:
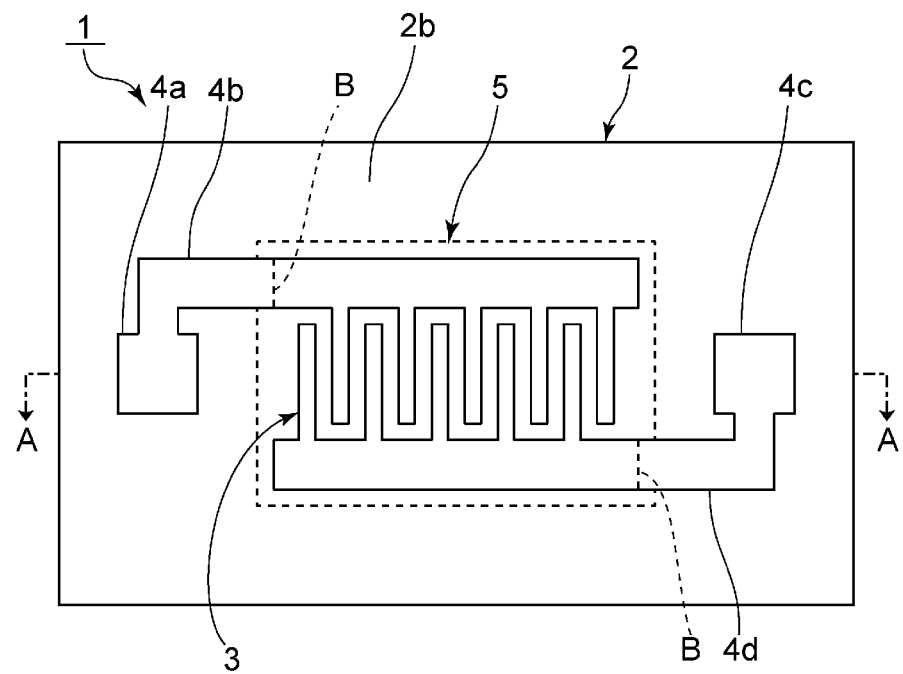
FIG. 2 is a plan view of the elastic wave device according to the first preferred embodiment of the present invention.

FIG. 1A is a front cross-sectional view of an elastic wave device according to a first preferred embodiment of the present invention, and FIG. 1B is a partially cut-out front cross-sectional view which illustrates a main portion of the elastic wave device in an enlarged manner. FIG. 2 is a plan view of the elastic wave device according to the first preferred embodiment. FIG. 1A corresponds to a cross section taken along line A-A of FIG. 2.

An elastic wave device 1 is not particularly limited. However, the elastic wave device 1 preferably is an elastic wave device that uses plate waves. The elastic wave device 1 includes a piezoelectric layer 2. The piezoelectric layer 2 includes a first main surface 2a and a second main surface 2b which is opposite the first main surface 2a. The piezoelectric layer 2 includes piezoelectric single crystal such as $LiNbO_3$ or $LiTaO_3$. A material of the piezoelectric layer 2 is not particularly limited. The piezoelectric layer 2 may be made from other piezoelectric materials.

An IDT electrode 3 as an excitation electrode is provided on the second main surface 2b of the piezoelectric layer 2. One busbar of the IDT electrode 3 is connected to a terminal electrode 4a with a wiring electrode 4b interposed therebetween. The other busbar of the IDT electrode 3 is connected to a terminal electrode 4c with a wiring electrode 4d interposed therebetween.

The IDT electrode 3, the terminal electrodes 4a and 4c and the wiring electrodes 4b and 4d may be made from metal or alloy in an appropriate manner.

A broken line B of FIG. 2 represents a border between a busbar and the wiring electrode 4b or the wiring electrode 4d.

An acoustic reflection layer 5 is laminated on the first main surface 2a side of the piezoelectric layer 2. A supporting layer 6 is laminated on a reinforcing substrate 7. At the supporting layer 6, a recessed portion which is open at the upper surface thereof is provided. The acoustic reflection layer 5 is filled into the recessed portion.

The thickness of the piezoelectric layer 2 is not particularly limited. However, it is desirable that the piezoelectric layer 2 has a thickness of about 100 nm or more and about 1000 nm or less, for example. In the case where the thickness of the piezoelectric layer 2 is about 100 nm or more, the piezoelectric layer 2 is less likely to be broken. In the case where the thickness of the piezoelectric layer 2 is about 1000 nm or less, the excitation efficiency of plate waves may be increased effectively.

In the elastic wave device 1 using plate waves, the thickness of the piezoelectric layer 2 is relatively thin. Therefore, the supporting layer 6 is laminated on the reinforcing substrate 7, and furthermore, the piezoelectric layer 2 is laminated on the supporting layer 6. The supporting layer 6 and the reinforcing substrate 7 may be made from an appropriate insulating resin, a piezoelectric material, or the like. As the above material, for example, silicon (Si), silicon oxide, silicon oxynitride, alumina, or the like may be used.

The acoustic reflection layer 5 includes a structure in which low acoustic impedance layers 5a, 5c, and 5e each including a pair of opposing main surfaces and high acoustic impedance layers 5b, 5d, and 5f each including a pair of opposing main surfaces are laminated in an alternating manner. The acoustic impedance of the high acoustic impedance layers 5b, 5d, and 5f is higher than the acoustic impedance of the low acoustic impedance layers 5a, 5c, and 5e.

It is desirable that the low acoustic impedance layers 5a, 5c, and 5e are made from the same material as that of the supporting layer 6. In this case, the number of types of materials may be reduced. Furthermore, a manufacturing process may be simplified. In this preferred embodiment, the supporting layer 6 is made from the same material as that of the low acoustic impedance layers 5a, 5c, and 5e. However, the high acoustic impedance layers 5b, 5d, and 5f may be made from the same material as that of the supporting layer 6 and the low acoustic impedance layers 5a, 5c, and 5e may be made from a material having an acoustic impedance lower than that of the supporting layer 6.

Furthermore, the low acoustic impedance layers 5a, 5c, and 5e and the high acoustic impedance layers 5b, 5d, and 5f may be made from materials different from that of the supporting layer 6.

A material of the low acoustic impedance layers 5a, 5c, and 5e is not particularly limited as long as the acoustic impedance of the low acoustic impedance layers 5a, 5c, and 5e is lower than the acoustic impedance of the high acoustic impedance layers 5b, 5d, and 5f.

As materials of the low acoustic impedance layers 5a, 5c, and 5e and the high acoustic impedance layers 5b, 5d, and 5f, ceramics, metal, or the like may be used. The material is not necessarily an insulator. A piezoelectric material may be used. Therefore, as materials of the low acoustic impedance layers 5a, 5c, and 5e and the high acoustic impedance layers 5b, 5d, and 5f, for example, ceramics such as silicon oxide, silicon nitride, silicon oxynitride, alumina, or zinc oxide, a piezoelectric material such as aluminum nitride, $LiTaO_3$, or $LiNbO_3$, or a metal such as W may be used. Preferably, for the low acoustic impedance layers 5a, 5c, and 5e, silicon oxide with a relatively low acoustic impedance is preferably used. Furthermore, for the high acoustic impedance layers 5b, 5d, and 5f, metal such as W, a piezoelectric material, or the like is preferably used.

In the acoustic reflection layer 5, the thickness of the low acoustic impedance layers 5a, 5c, and 5e and the high acoustic impedance layers 5b, 5d, and 5f is not particularly limited. However, it is preferable that the thickness is about 100 nm or more and about 500 nm or less, for example. With a thickness within this range, the entire thickness of the acoustic reflection layer 5 is not very thick, and therefore, a reduction in the thickness of the elastic wave device 1 is achieved effectively.

The thickness of the supporting layer 6 is not particularly limited as long as the supporting layer 6 surrounds the acoustic reflection layer 5. In the elastic wave device 1, the supporting layer 6 reaches below the acoustic reflection layer 5. However, the supporting layer 6 does not necessarily exist below the acoustic reflection layer 5. That is, the lower surface of the acoustic reflection layer 5 may be directly laminated on the reinforcing substrate 7.

When the acoustic reflection layer 5 is viewed in plan, the acoustic reflection layer 5 is provided at a position where the acoustic reflection layer 5 and the IDT electrode 3 overlap each other. Accordingly, even if plate waves excited by the IDT electrode 3 leak toward the acoustic reflection layer 5 side, the plate waves are reflected by the acoustic reflection layer 5, and the excitation efficiency of the plate waves may thus be increased.

The elastic wave device 1 according to this preferred embodiment including the acoustic reflection layer 5 with an unwanted wave reflection suppression structure 5x. That is, as illustrated in FIG. 1B in an enlarged manner, at the outer peripheral edge of the acoustic reflection layer 5, outer peripheral edges of individual pairs of opposing main surfaces of the low acoustic impedance layers 5a, 5c, and 5e and the high acoustic impedance layers 5b, 5d, and 5f are curved so as not to be located within surfaces where the individual main surfaces at the center of the acoustic impedance layers 5a to 5f are extended in an outer peripheral edge direction.

In the elastic wave device 1, unwanted waves generated at the piezoelectric layer 2 leak, along with plate waves to be used, toward the acoustic reflection layer 5 side. In this case, if the interface between the low acoustic impedance layers 5a, 5c, and 5e and the high acoustic impedance layers 5b, 5d, and 5f is flat, the unwanted waves are uniformly reflected at the outer peripheral side surface of the acoustic reflection layer 5 and are less likely to be attenuated. Accordingly, unwanted waves return to the piezoelectric layer 2, and influence of the unwanted waves appears on resonance characteristics, filter characteristics, and the like.

In contrast, in this preferred embodiment, with the provision of the unwanted wave reflection suppression structure 5x, unwanted waves which have reached the outer peripheral side surface of the acoustic reflection layer 5 are irregularly reflected. Accordingly, unwanted waves are less likely to return to the piezoelectric layer 2, and degradation in the characteristics by unwanted waves is less likely to occur.

As illustrated in FIG. 1B, in this preferred embodiment, regarding all of the low acoustic impedance layers 5a, 5c, and 5e and the high acoustic impedance layers 5b, 5d, and 5f, a portion of the outer peripheral edges of the individual pairs of opposing main surfaces are curved so as not to be located within the surfaces where the individual main surfaces at the center of the acoustic impedance layers 5a to 5f are extended in the outer peripheral edge direction. However, making at least a portion of the outer peripheral edges of the individual main surfaces of at least one of the low acoustic impedance layers and the high acoustic impedance layers curved so as not to be located within the surfaces where the individual main surfaces at the center of the acoustic impedance layers are extended in the outer peripheral edge direction may cause unwanted waves to be irregularly reflected.

Furthermore, in this preferred embodiment, the three-layer low acoustic impedance layers 5a, 5c, and 5e and the three-layer high acoustic impedance layers 5b, 5d, and 5f are laminated. However, the number of laminated low acoustic impedance layers and the number of laminated high acoustic impedance layers are not particularly limited. At least one low acoustic impedance layer needs to be provided.

Figure 3:
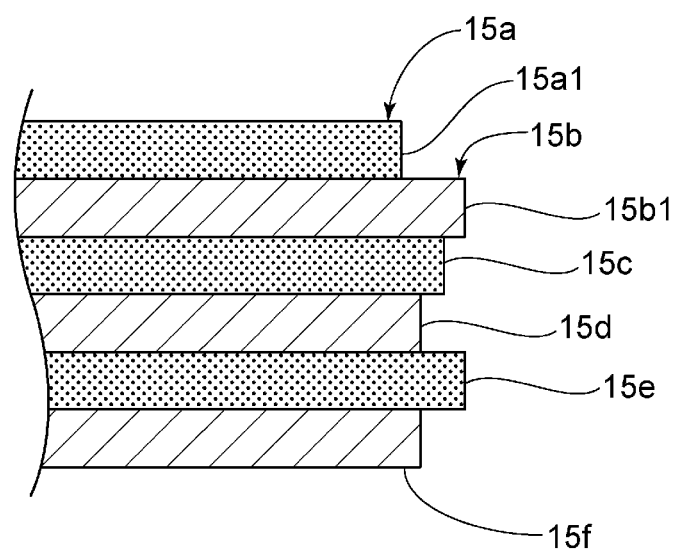
FIG. 3 is a partially cut-out front cross-sectional view for explaining an unwanted wave reflection suppression structure of an elastic wave device according to a second preferred embodiment of the present invention.

FIG. 3 is a partially cut-out front cross-sectional view for explaining an unwanted wave reflection suppression structure of an elastic wave device according to a second preferred embodiment of the present invention. As illustrated in FIG. 3, in the elastic wave device according to the second preferred embodiment, an acoustic reflection layer 15 includes a structure in which low acoustic impedance layers 15a, 15c, and 15e and high acoustic impedance layers 15b, 15d, and 15f are laminated in an alternating manner. In this structure, an outer peripheral side surface 15a1 of the low acoustic impedance layer 15a is separate from an outer peripheral side surface 15b1 of the adjacent high acoustic impedance layer 15b with a step therebetween. In a similar manner, outer peripheral side surfaces of the low acoustic impedance layers 15c and 15e are separate from outer peripheral side surfaces of the adjacent high acoustic impedance layers 15b, 15d, and 15f among the high acoustic impedance layers 15b, 15d, and 15f with a step therebetween. Accordingly, variations occur between the phase of unwanted waves reflected by the outer peripheral side surfaces of the low acoustic impedance layers 15a, 15c, and 15e and the phase of unwanted waves reflected by the outer peripheral side surfaces of the high acoustic impedance layers 15b, 15d, and 15f, for example, the outer peripheral side surface 15b1. Therefore, the unwanted waves partially cancel each other out. Thus, a situation in which unwanted waves are reflected by the acoustic reflection layer 15 and return toward the piezoelectric layer side is effectively reduced or prevented.

An outer peripheral side surface of at least one of the high acoustic impedance layers 15b, 15d, and 15f and the low acoustic impedance layers 15a, 15c, and 15e preferably is separate from outer peripheral side surfaces of other layers with a step therebetween. Even in this case, variations in the phase of unwanted waves partially occur. Therefore, reflection of unwanted waves is effectively reduced or prevented.

Also in the second preferred embodiment, the number of low acoustic impedance layers and high acoustic impedance layers of the acoustic reflection layer 15 is not particularly limited.

Next, a non-limiting example of a manufacturing method for the elastic wave device according to the first preferred embodiment will be explained with reference to FIGS. 4A to 4D, FIGS. 5A and 5B, and FIGS. 6A to 6C.

Figure 4A:
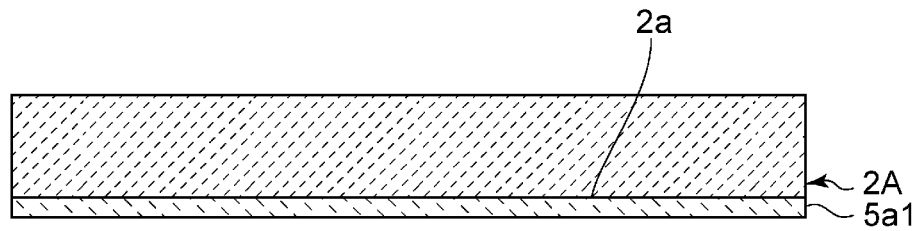
FIGS. 4A to 4D are front cross-sectional views for explaining a manufacturing method for the elastic wave device according to the first preferred embodiment of the present invention.
Figure 4B:
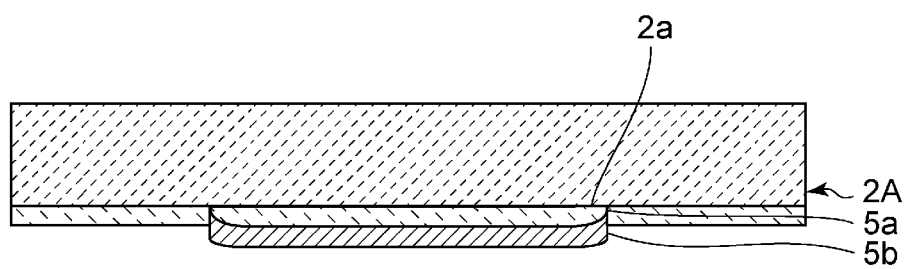

As illustrated in FIG. 4A, a low acoustic impedance layer 5a1 is formed by forming a film of silicon oxide on one main surface of a piezoelectric substrate 2A by sputtering. Next, as illustrated in FIG. 4B, a high acoustic impedance layer 5b is formed on the low acoustic impedance layer 5a. For example, the high acoustic impedance layer 5b is formed by an evaporation lift off method using a photolithography technology. In the process of patterning, by controlling a resist shape and a method for electrode formation, for example, the high acoustic impedance layer 5b made from metal and the low acoustic impedance layer 5a made from silicon oxide may be curved so that a portion of the outer peripheral edges of the acoustic impedance layers are not located within the surfaces where the center of the acoustic impedance layers is extended in an outer peripheral edge direction, as illustrated in the drawing.

Figure 4C:
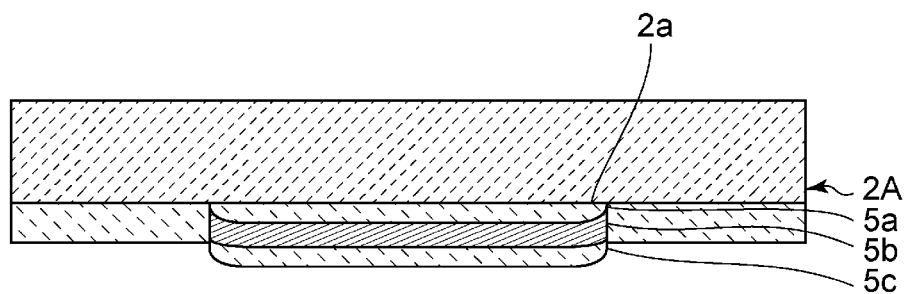

After that, as illustrated in FIG. 4C, the silicon oxide film is formed so that the low acoustic impedance layer 5c is formed. A portion of the silicon oxide film that is deposited on the high acoustic impedance layer 5b forms the low acoustic impedance layer 5c. A portion deposited around the low acoustic impedance layer 5c is laminated on the low acoustic impedance layer 5a1, which is formed at first.

Figure 4D:
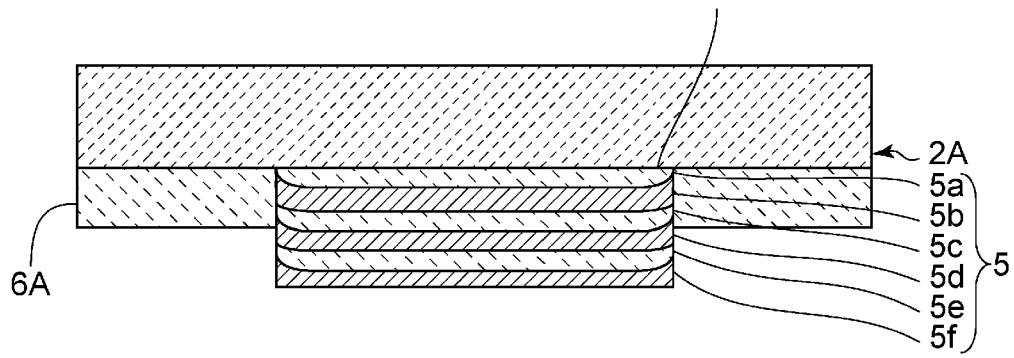

After that, as illustrated in FIG. 4D, in a similar manner described above, the high acoustic impedance layer 5d, the low acoustic impedance layer 5e, and the high acoustic impedance layer 5f are formed sequentially. In accordance with this, a supporting layer portion 6A made from silicon oxide is formed around the acoustic reflection layer 5. In the formation of the acoustic reflection layers, an outer peripheral side surface of at least one of high acoustic impedance layers and low acoustic impedance layers may be separate from outer peripheral side surfaces of other layers with a step therebetween. This may be attained by controlling a resist shape and a method for electrode formation in the process of patterning.

Figure 5A:
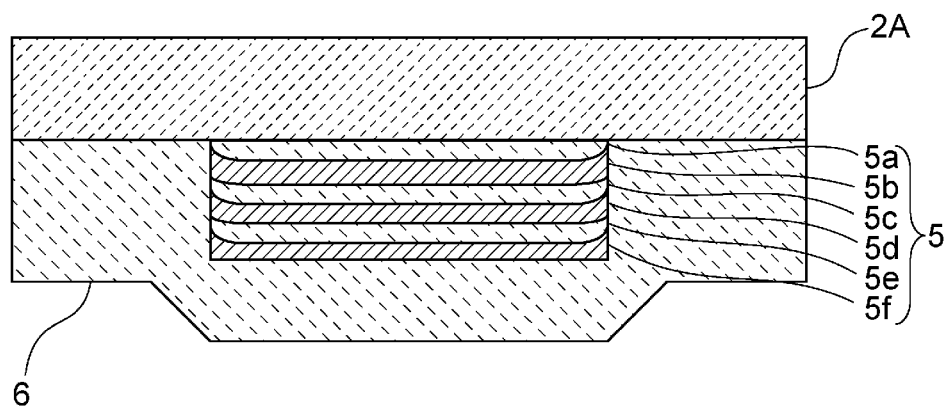
FIGS. 5A and 5B are front cross-sectional views for explaining a manufacturing method for the elastic wave device according to the first preferred embodiment of the present invention.

Next, as illustrated in FIG. 5A, a silicon oxide film is formed by sputtering or the like so that the supporting layer 6 is formed.

Figure 5B:
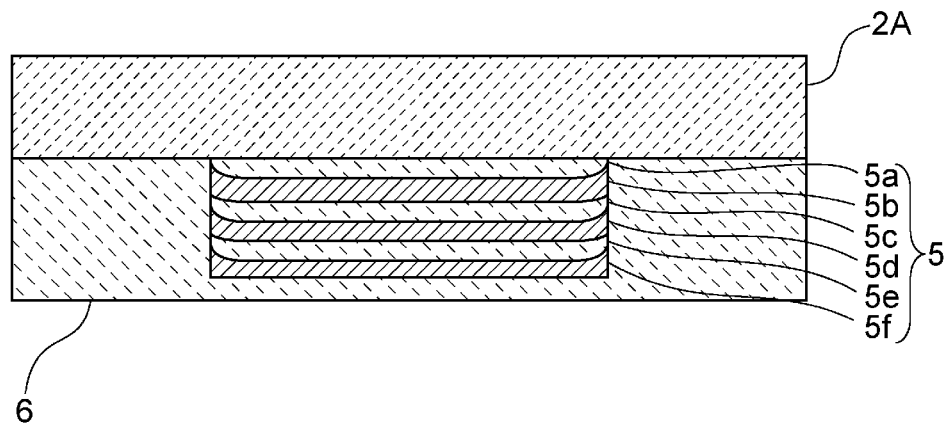
Figure 6A:
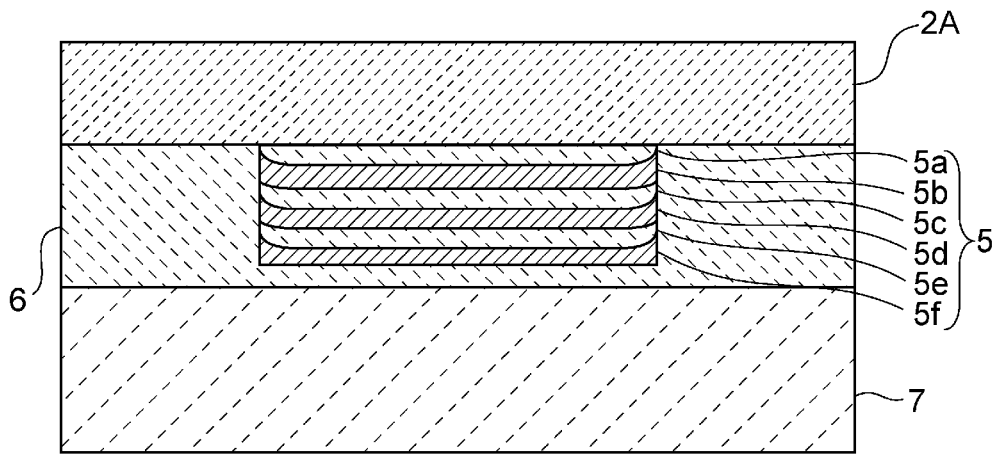
FIGS. 6A to 6C are front cross-sectional views for explaining a manufacturing method for the elastic wave device according to the first preferred embodiment of the present invention.
Figure 6B:
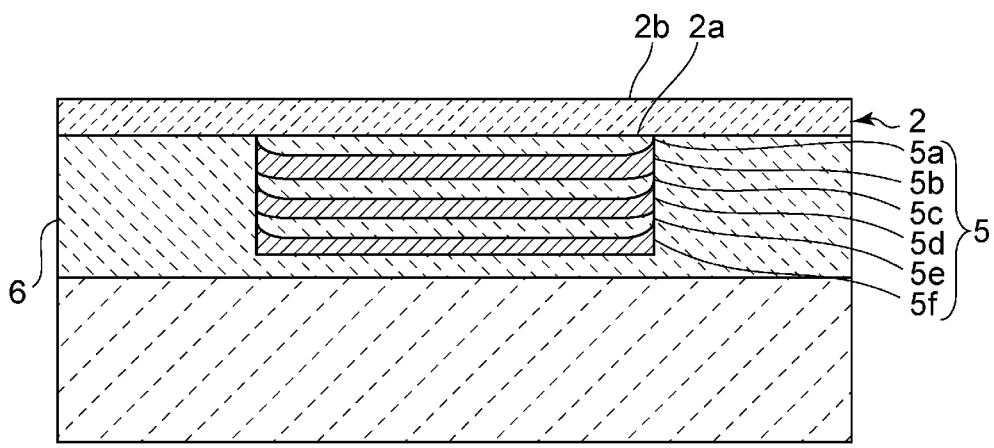

Next, the supporting layer 6 is rubbed down so that the surface of the supporting layer 6 that is opposite the piezoelectric substrate 2A is made flattened, as illustrated in FIG. 5B. After that, as illustrated in FIG. 6A, for reinforcement, the reinforcing substrate 7 is laminated on the surface of the supporting layer 6 that is opposite the piezoelectric substrate 2A. As the reinforcing substrate, for example, Si, $SiO_2$, or the like is used. Next, as illustrated in FIG. 6B, the thickness of the piezoelectric substrate 2A is reduced. The reduction in the thickness is achieved by directly rubbing down the substrate, providing a high-density ion implantation portion at the piezoelectric substrate 2A and detaching portion of the piezoelectric substrate 2A from the high-density ion implantation portion, or the like.

Figure 6C:
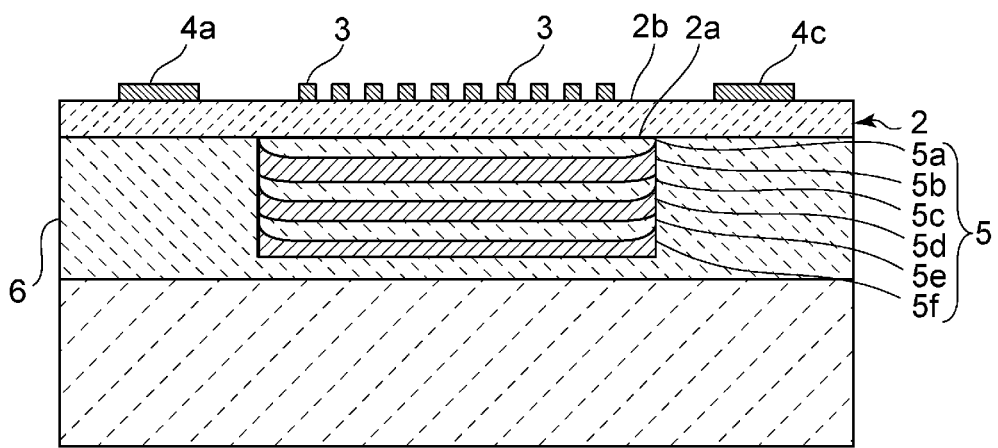

After that, as illustrated in FIG. 6C, the IDT electrode 3, the terminal electrodes 4a and 4c, and the like are formed on the second main surface 2b of the piezoelectric layer 2.

In the first and second preferred embodiments, the elastic wave devices including the IDT electrode 3 and using plate waves have been described. However, the present invention is not limited to an elastic wave device using plate waves.

Figure 7:
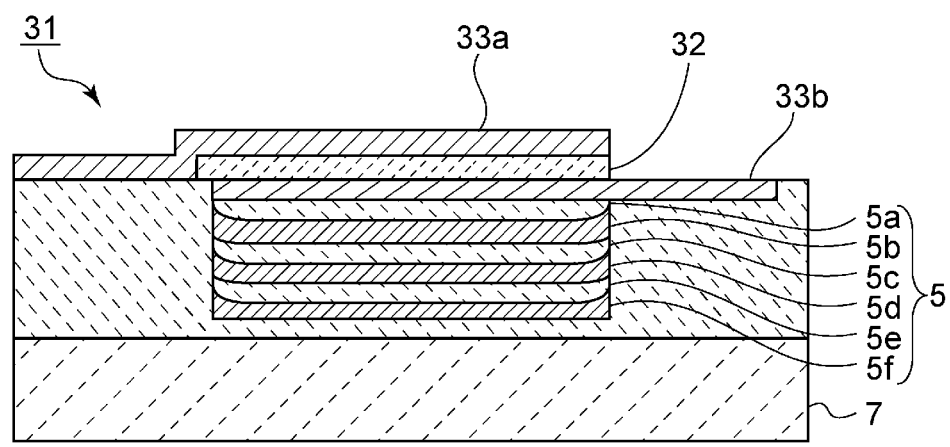
FIG. 7 is a front cross-sectional view for explaining an elastic wave device according to a third preferred embodiment of the present invention.

FIG. 7 is a front cross-sectional view of an elastic wave device using bulk waves according to a third preferred embodiment of the present invention.

In an elastic wave device 31, the acoustic reflection layer 5 is laminated on the reinforcing substrate 7. Furthermore, a first excitation electrode 33a is laminated on an upper surface of a piezoelectric layer 32, and a second excitation electrode 33b is laminated on a lower surface, which is a first main surface of the piezoelectric layer 32.

By applying an AC electric field from the first and second excitation electrodes 33a and 33b, the elastic wave device 31 uses bulk waves excited by the piezoelectric layer 32. That is, bulk waves are excited by the first excitation electrode 33a and the second excitation electrode 33b.

Also in this preferred embodiment, at least portion of outer peripheral edges of individual main surfaces of at least one of acoustic reflection layers is curved so as not to be located within the surfaces where the individual main surfaces at the center of the at least one layer are extended in an outer peripheral edge direction. Accordingly, as in the first preferred embodiment, reflection of unwanted waves toward the piezoelectric layer 32 side is significantly reduced or prevented. Also in the third preferred embodiment, an unwanted wave reflection suppression structure is not limited to the structure described above. As in the second preferred embodiment, an outer peripheral side surface of at least one of the high acoustic impedance layers 5b, 5d, and 5f and the low acoustic impedance layers 5a, 5c, and 5e may be separate from outer peripheral side surfaces of other layers with a step therebetween.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a piezoelectric layer that includes a first main surface and a second main surface opposite to the first main surface;
a first excitation electrode and a second excitation electrode that are in contact with the piezoelectric layer; and
an acoustic reflection layer that is provided on the first main surface of the piezoelectric layer; wherein
the acoustic reflection layer includes a high acoustic impedance layer including a pair of opposing main surfaces and with a relatively high acoustic impedance and a low acoustic impedance layer including a pair of opposing main surfaces and with a relatively low acoustic impedance; and
in the acoustic reflection layer, outer peripheral edges of individual main surfaces of the pair of main surfaces of at least one of the low acoustic impedance layer and the high acoustic impedance layer are curved so as not to be located within surfaces where the individual main surfaces at a center of the at least one of the low acoustic impedance layer and the high acoustic impedance layer are extended in an outer peripheral edge direction.

2. The elastic wave device according to claim 1, wherein each of the first and second excitation electrodes is an interdigital transducer (IDT) electrode provided on at least one of the first main surface and the second main surface of the piezoelectric layer.

3. The elastic wave device according to claim 2, wherein the IDT electrode is provided on the second main surface of the piezoelectric layer.

4. The elastic wave device according to claim 1, wherein each of the first and second excitation electrodes is an interdigital transducer (IDT) electrode and plate waves excited by the IDT electrode are used.

5. The elastic wave device according to claim 1, wherein the first excitation electrode is provided on the first main surface of the piezoelectric layer and the second excitation electrode is provided on the second main surface of the piezoelectric layer.

6. The elastic wave device according to claim 5, wherein bulk waves are excited by the first excitation electrode and the second excitation electrode.

7. An elastic wave device comprising:
a piezoelectric layer that includes a first main surface and a second main surface opposite to the first main surface;
a first excitation electrode and a second excitation electrode that are in contact with the piezoelectric layer; and
an acoustic reflection layer that is provided on the first main surface of the piezoelectric layer; wherein
the acoustic reflection layer includes a high acoustic impedance layer with a relatively high acoustic impedance and a low acoustic impedance layer with a relatively low acoustic impedance; and
on an outer peripheral side surface of the acoustic reflection layer, an outer peripheral side surface of at least one of the high acoustic impedance layer and the low acoustic impedance layer is separate from outer peripheral side surfaces of other layers with a step therebetween.

8. The elastic wave device according to claim 7, wherein each of the first and second excitation electrodes is an interdigital transducer (IDT) electrode provided on at least one of the first main surface and the second main surface of the piezoelectric layer.

9. The elastic wave device according to claim 8, wherein the IDT electrode is provided on the second main surface of the piezoelectric layer.

10. The elastic wave device according to claim 7, wherein each of the first and second excitation electrodes is an interdigital transducer (IDT) electrode and plate waves excited by the IDT electrode are used.

11. The elastic wave device according to claim 7, wherein the first excitation electrode is provided on the first main surface of the piezoelectric layer and the second excitation electrode is provided on the second main surface of the piezoelectric layer.

12. The elastic wave device according to claim 11, wherein bulk waves are excited by the first excitation electrode and the second excitation electrode.

13. A manufacturing method for the elastic wave device according to claim 1, the method comprising:
a step of forming the acoustic reflection layer on the piezoelectric layer; and
a step of forming the first and second excitation electrodes to be in contact with the piezoelectric layer; wherein
in a process of forming the acoustic reflection layer, the outer peripheral edges of the individual main surfaces of the pair of main surfaces of the at least one of the high acoustic impedance layer and the low acoustic impedance layer are curved so as not to be located within the surfaces where the individual main surfaces at the center of the at least one of the high acoustic impedance layer and the low acoustic impedance layer are extended in the outer peripheral edge direction.

14. A manufacturing method for the elastic wave device according to claim 7, the method comprising:
a step of forming the acoustic reflection layer on the piezoelectric layer; and
a step of forming the first and second excitation electrodes to be in contact with the piezoelectric layer; wherein
in a process of forming the acoustic reflection layer, the at least one of the high acoustic impedance layer and the low acoustic impedance layer is provided such that the outer peripheral side surface of the at least one of the high acoustic impedance layer and the low acoustic impedance layer is separate from the outer peripheral side surfaces of the other layers with a step therebetween.

* * * * *